United States Patent
Botelho et al.

(10) Patent No.: US 6,474,077 B1
(45) Date of Patent: Nov. 5, 2002

(54) VAPOR DELIVERY FROM A LOW VAPOR PRESSURE LIQUEFIED COMPRESSED GAS

(75) Inventors: Alexandre De Almeida Botelho, Bethlehem, PA (US); Ali Fouad El-Agha, Allentown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 10/015,495

(22) Filed: Dec. 12, 2001

(51) Int. Cl.[7] .................................................. F25J 1/00
(52) U.S. Cl. ........................................ 62/50.2; 62/45.1
(58) Field of Search .............................. 62/45.1, 48.1, 62/50.2, 606, 616

(56) References Cited

U.S. PATENT DOCUMENTS

| | | | |
|---|---|---|---|
| 5,644,921 A | 7/1997 | Chowdhury | 62/48.1 |
| 5,673,562 A | 10/1997 | Friedt | 61/48 |
| 5,761,911 A | 6/1998 | Jurcik et al. | 62/50.2 |
| 6,985,548 | 7/2000 | Chowdhury et al. | 62/617 |
| 6,199,384 B1 * | 3/2001 | Udischas et al. | 62/48.1 |
| 6,217,659 B1 | 4/2001 | Botelho et al. | 118/715 |
| 6,349,546 B1 * | 2/2002 | Yoo | 62/50.2 |

* cited by examiner

*Primary Examiner*—William C. Doerrler
*Assistant Examiner*—Malik N. Drake
(74) *Attorney, Agent, or Firm*—John M. Fernbacher

(57) ABSTRACT

Method for delivering a vapor component product to an end user from a storage system which contains the component in coexisting liquid and vapor phases. The method comprises withdrawing from the storage system a component stream comprising vapor at a first total pressure and a first temperature, passing the component stream through a transfer line to a reservoir having an inlet and an outlet, and condensing vapor in the reservoir to provide a liquid component at a second total pressure and a second temperature at the outlet of the reservoir. The liquid component is withdrawn from the outlet of the reservoir and vaporized to yield the vapor component, which is provided to the end user. The invention includes apparatus to effect the steps of this method.

17 Claims, 1 Drawing Sheet

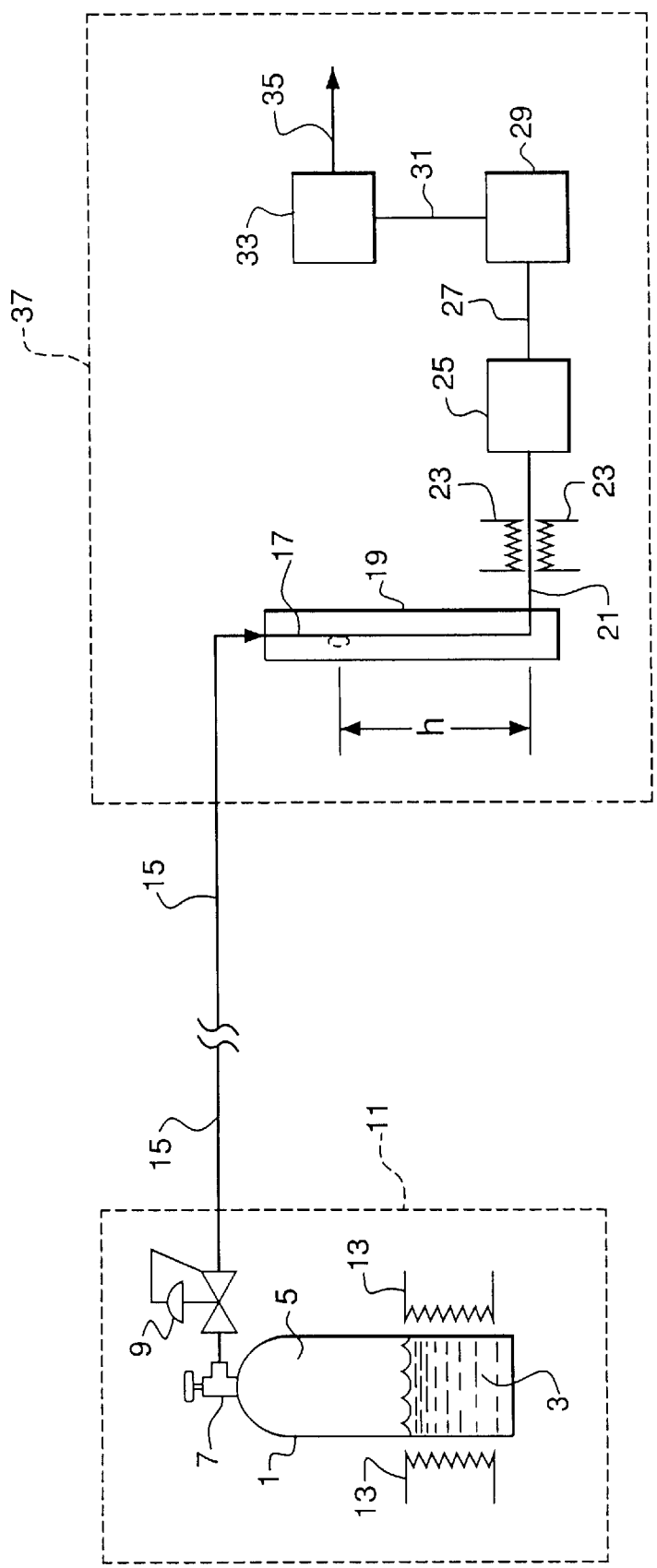

US 6,474,077 B1

VAPOR DELIVERY FROM A LOW VAPOR PRESSURE LIQUEFIED COMPRESSED GAS

BACKGROUND OF THE INVENTION

Industrial gases which are utilized in small to moderate volumes are stored at ambient temperature in pressurized cylinders from which gas is withdrawn as needed. A pressure regulator generally is used to deliver the gas to the consumer at a constant pressure. Gases which have critical temperatures below ambient temperature are stored as supercritical fluids at maximum pressures determined by the design pressure ratings of the cylinders. Examples of these include low-boiling gases such as nitrogen, oxygen, hydrogen, helium, and methane, which are withdrawn from the storage cylinders without phase change. Gases which have critical temperatures above ambient temperature are stored in cylinders as saturated liquids at their respective vapor pressures, and these liquids vaporize as saturated vapor is withdrawn from the cylinders. Common examples of liquefied compressed gases are chlorine, ammonia, and light hydrocarbons such as propane and butane.

Some liquefied compressed gases have vapor pressures at ambient temperature which are not far above atmospheric pressure. Many of these are specialty gases used by the electronics industry in the manufacture of semiconductor and fiber optic devices. Examples of such specialty gases include tungsten hexafluoride, disilane, dichlorosilane, trimethylsilane, hydrogen fluoride, and boron trichloride. These gases must be delivered from storage cylinders to the manufacturing process tools at high purity under carefully-controlled conditions.

Because these specialty gases have low vapor pressures, i.e., vapor pressures which are not far above atmospheric pressure, condensation can occur under certain operating conditions during gas transfer from a storage cylinder to the process tool. This is undesirable because condensation can interfere with the operation of downstream instruments such as flow controllers, can cause pressure fluctuations in the gas delivery system, and in certain cases can result in impurities in the transferred gas caused by leaching of metal components from the delivery system piping.

It is common practice in the industry to heat and insulate the transfer lines to prevent this undesirable condensation. While this practice is effective in preventing undesirable condensation, heat tracing can be a high-maintenance item which is subject to failure at unpredictable times. Such failure can adversely impact the operation of the process tool and affect the efficiency of the overall manufacturing process. Regular monitoring of heat tracing systems can be cost-prohibitive and as a result usually is not practiced. In addition, the need for heat tracing generally minimizes the distance between the gas storage cylinder and the consumer.

It would be desirable to reduce or eliminate the need for heat tracing and insulation of the lines which transfer these specialty gases from storage cylinders to process tools. The invention described below and defined by the claims which follow addresses this need with a method for transferring such specialty gases which can prevent condensation without the use of heat tracing.

BRIEF SUMMARY OF THE INVENTION

The invention relates to a method for delivering a vapor component product to an end user from a storage system which contains the component in coexisting liquid and vapor phases. The method comprises:

(a) withdrawing from the storage system a component stream comprising vapor at a first total pressure and a first temperature;

(b) passing the component stream through a transfer line to a reservoir having an inlet and an outlet, and condensing vapor in the reservoir to provide a liquid component at a second total pressure and a second temperature at the outlet of the reservoir; and (c) withdrawing the liquid component from the outlet of the reservoir, vaporizing the liquid component to yield the vapor component, and providing the vapor component to the end user.

The coexisting liquid and vapor phases of the component in the storage system may be contained in a storage vessel, and a vapor stream may be withdrawn from the storage vessel while liquid is vaporized therein. The component stream withdrawn from the storage system in (a) may be provided by regulating the pressure of the vapor stream from the storage vessel to provide the component stream at the first total pressure. If desired, the storage vessel may be heated.

The dynamic pressure differential defined by the difference between the first total pressure and the second total pressure may be at least about 1.25 psi. The difference between the first temperature and the second temperature may be at least about 15° F. The component stream in the transfer line may be essentially all vapor.

The component may be an essentially pure compound selected from the group consisting of tungsten hexafluoride, disilane, dichlorosilane, trichlorosilane, trimethylsilane, perfluorobutadiene, and chlorine. The total pressure at any point in the transfer line may be less than the vapor pressure of the compound at a temperature equal to the temperature at that point in the transfer line. The second total pressure at the outlet of the reservoir may be greater than the total pressure of the component stream at the inlet of the reservoir.

The invention also relates to a method for controlling the delivery of a vapor component product to an end user from a storage system which contains the component in coexisting liquid and vapor phases, wherein the method comprises:

(a) withdrawing from the storage system a component stream comprising vapor at a first total pressure and a first temperature;

(b) passing the component stream through a transfer line to a reservoir having an inlet and an outlet, and condensing vapor in the reservoir to provide a liquid component at a second total pressure and a second temperature at the outlet of the reservoir;

(c) withdrawing the liquid component from the reservoir, vaporizing the liquid component to yield the vapor component, and providing the vapor component to the end user; and (d) controlling the first total pressure and the second temperature such that the component stream in the transfer line is essentially all vapor.

The invention also includes a system for delivering a vapor component product to an end user from a storage system which contains the component in coexisting liquid and vapor phases, wherein the system comprises:

(a) storage vessel which contains the component in coexisting liquid and vapor phases, wherein the storage vessel has an outlet for the withdrawal of vapor from the vessel;

(b) a reservoir having an inlet and an outlet;

(c) a transfer line for transferring a component stream comprising vapor from the storage vessel to the inlet of the reservoir;

(d) cooling means for cooling the reservoir and condensing vapor to form a condensed component therein;

(e) piping means for withdrawing the condensed component from the outlet end of the reservoir; and (f) heating means for vaporizing the condensed component to provide the vapor component to the end user.

The system may further comprise pressure regulating means installed between the storage vessel and the transfer line. The storage vessel may be made of a metal containing at least 99.9 weight % nickel.

The reservoir may be a vertically-oriented cylindrical vessel having an upper end and a lower end, wherein the outlet is at the lower end, and wherein the vessel has a height to diameter ratio of at least about five. This cylindrical vessel may be made of a metal containing at least 99.9 weight % nickel. The condensed component in the reservoir typically forms a liquid column with a height of at least about 12 inches above the outlet of the reservoir.

BRIEF DESCRIPTION OF SEVERAL VIEWS OF THE DRAWINGS

The single FIGURE is a schematic flow diagram of an exemplary embodiment of the present invention.

DETAILED DESCRIPTION OF THE INVENTION

The present invention relates to an improved method for the transfer of low-boiling gases from pressurized liquid storage cylinders to end users while minimizing or eliminating condensation in the transfer lines. The method can be applied, for example, in the transfer of specialty gases from liquid storage cylinders in gas cabinets to process tools used in the semiconductor manufacturing industry. The method utilizes a thermosiphon system which maintains a temperature differential to assist in the transfer of gas between the storage cylinder and a cold reservoir. Condensation occurs in the cold reservoir which provides a static head of liquid, and the liquid is withdrawn therefrom and vaporized. The gas may be delivered to the flow controller as a superheated vapor at a pressure higher than the gas pressure in the transfer line from the gas storage cylinder.

The method is illustrated in the exemplary schematic flow diagram of the single FIGURE. Cylinder 1 contains liquid 3 which typically is in thermal equilibrium or near thermal equilibrium with vapor 5. The total pressure within cylinder 1 is essentially the vapor pressure of liquid 3 at the temperature of cylinder 1. Cylinder 1 may be constructed of nickel or a high nickel alloy to minimize reaction with certain contained liquids. Liquid 3 typically is an essentially pure component which may contain certain impurities at low concentration. The impurities and concentration of the impurities may depend upon the particular component in liquid 3. The term "essentially pure" as used herein means that the concentration of total impurities is less than about 0.5 mole %.

Cylinder 1 is typically fitted with shutoff valve 7 and pressure regulator 9, and may be installed in gas cabinet 11 which maintains a safe and controlled location for the cylinder. Gas cabinet 11 may contain multiple cylinders which are connected to gas manifolds. Heater 13 may be used to heat cylinder to 1 promote vaporization of liquid 3, for example, under high gas withdrawal rates. Transfer line 15, which may extend a considerable distance, transfers gas from pressure controller 9 to reservoir 17. Transfer line 15, which may be double-walled tubing, may be made of type 316 stainless steel.

Reservoir 17 is vertically-oriented and typically is a length of tubing or a small vessel which may have a height to diameter ratio in the range of about 5 to about 500. Reservoir 17 is cooled sufficiently by cooling system 19 to condense the gaseous component provided via transfer line 15 such that an inventory of condensed liquid having height h collects in the reservoir. Height h may be between about 1.0 inches and about 60 inches. The pressure exerted by the static head of condensed liquid in reservoir 17 preferably is equal to or greater than the dynamic pressure drop of the flowing fluid between the outlet of reservoir 17 and the inlet to reactor system 33. This liquid head provides a buffer to the variable dynamic pressure drop or dynamic pressure differential which occurs during normal system operation. The dynamic pressure drop or dynamic pressure differential is defined as the pressure drop or pressure differential of the flowing fluid between any two points in the system.

Reservoir 17 may be constructed of nickel or a high nickel alloy to minimize reaction with certain contained liquids. The selection of the desired temperature of reservoir 17 will depend chiefly upon the component vapor pressure characteristics, the total pressure just downstream of pressure regulator 9, the flow rate of the component, and the ambient temperature of transfer line 15. The lower limit of the reservoir temperature is the freezing point of the component.

The terms "pressure" and "total pressure" as used herein are interchangeable and have the usual meaning wherein the pressure in an enclosed volume is the force exerted per unit area by the gas on the walls of the volume. The term "vapor pressure" has the usual thermodynamic meaning. For a pure component in an enclosed system at a given pressure, the component vapor pressure is essentially equal to the total pressure in the system.

Cooling system 19 may utilize a recirculating refrigerant provided by a mechanical refrigeration system, cooling water, a vaporizing cryogenic liquid such as liquid nitrogen, or any other known cooling means to achieve the desired temperature. The amount of refrigeration provided by cooling system 19 typically is determined by the flow rate and latent heat of the gas being condensed, and may also depend upon the heat transfer characteristics of reservoir 17 as well as the insulation design of the system.

Liquid is withdrawn from reservoir 17 via line 21 at a total pressure approximately equal to the liquid head h plus the total pressure of the gas at the inlet of reservoir 17. Withdrawn liquid is vaporized and optionally superheated in heater 23, and the vaporized component may pass through filter 25 to remove any particulate material or liquid mist which may be present. The gaseous component passes via line 27 into mass flow controller 29 and via line 31 to reactor system or deposition chamber 33, wherein the component is utilized in selected reactions to produce fabricated electronic components such as semiconductors. Vent gas is withdrawn via line 35 for recovery or disposal.

Components 17, 19, 23, 25, 29, and 31, and the connecting piping, may be considered as parts of generic process tool 37. This process tool may be located a considerable distance from gas cabinet 11.

The volume and height h of the liquid in reservoir 17 serves two purposes in the present invention. First, the reservoir capacity provides an inventory of the component which ensures proper delivery at varying demand from mass flow controller 29. Second, the liquid head h provides a boost to the inlet pressure of mass flow controller 29, which improves overall process operation. As an example, if the liquid component is tungsten hexalfuoride, a static pressure of 0.125 psia per inch of liquid head can be realized at the bottom of reservoir 17.

The dynamic pressure differential between the outlet of pressure regulator 9 and the inlet of reservoir 17 may be at least about 1.0 psi. The dynamic pressure differential between the outlet of pressure regulator 9 and the outlet of reservoir 17 with a liquid column height of 18 inches, for example with liquid tungsten hexafluoride, may be at least about 1.25 psi. The difference between the temperature at the outlet of pressure regulator 9 and the outlet of reservoir 17 may be at least about 15° F.

The method of the present invention can be used to increase the mass flow capacity of the system by increasing the cooling rate of cooling system 19 and by utilizing heater 13 on cylinder 1 as required. Gas flow is effected by the pressure differential between the outlet of pressure regulator 9 and the inlet of reservoir 17, and this differential pressure may be controlled to maximize component flow while minimizing or eliminating condensation in transfer line 15. The temperature of reservoir 17 is controlled by means of the temperature setting of cooling system 19, and the pressure at the inlet to reservoir 17 is determined by the vapor pressure of the component at that temperature. Pressure regulator 9 typically is a spring-loaded or gas-loaded diaphragm-type regulator, and the pressure just downstream of the regulator can be set by adjusting the diaphragm loading. The selection of the delivery pressure of regulator 9 and the temperature of reservoir 17 are two convenient parameters which control the pressure differential in transfer line 15, and the proper selection of these parameters can minimize or eliminate condensation in transfer line 15.

The gas demand of reactor system or deposition chamber 33 typically varies in a cyclic manner, since the processing therein is carried out in a batch mode. This varying gas demand stresses a conventional gas delivery system and may promote condensation because of unsteady-state flows and pressure drops in the system. The method of the present invention can accommodate cyclic gas demands and minimize or eliminate condensation in the transfer line by virtue of the liquid inventory in reservoir 17.

The following Examples illustrate the present invention but do not limit the invention to any of the specific details described therein.

EXAMPLE 1

Cylinder 1 (see FIGURE) contains tungsten hexafluoride ($WF_6$) at 70° F. and a cylinder pressure of 17.1 psia (884 torr). Vaporized $WF_6$ is withdrawn through shutoff valve 6 and flows through pressure regulator 9, which is set to control the regulator outlet pressure at 10 psia (517 torr). Vapor flows through transfer line 15 at the ambient temperature of 70° F. and is condensed in reservoir 17. Reservoir 17 is cooled and maintained at 40° F., at which temperature the saturated vapor pressure of $WF_6$ is 8.7 psia (450 torr). The static pressure differential between the outlet of pressure regulator 9 and the top of the condensed liquid in reservoir 17 is 1.3 psi (67 torr). As long as this static pressure differential is greater than the dynamic pressure drop of the flowing vapor in transfer line 15 between regulator 9 and the inlet to reservoir 17, no condensation will occur in the transfer line. In this example, the dynamic pressure drop of the flowing vapor in transfer line 15 between regulator 9 and the inlet to reservoir 17 is 1.0 psi.

Refrigeration is provided by cooling system 19 using recirculating chilled water. An average liquid height h of 18 inches is maintained in reservoir 17, which provides a differential liquid head of 2.25 psi. The total pressure at the outlet of reservoir 17 is 11.25 psia. Liquid flows through line 21 and is totally vaporized in heater 23 to provide vapor at 80° F. to mass flow controller 29. Mass flow controller 29 provides $WF_6$ vapor to process tool 33 at a pressure of 5.0 psia.

EXAMPLE 2

Reaction system 33 requires a varying flow rate of $WF_6$ to provide the reactive gas for the predetermined cyclic batch process steps effected therein. The gas flow rates and delivery schedule for one cycle are summarized in Table 1 below.

TABLE 1

| Gas Flow Rates and Cycle times for Example 2 | |
|---|---|
| Elapsed Time, sec. | $WF_6$ Flow Rate, sccm |
| 0-100 | 0 |
| 100-130 | 40 |
| 130-150 | 0 |
| 150-200 | 300 |
| 200-250 | 0 |

Thus the present invention provides an improved method for the transfer of low-boiling gases from pressurized liquid storage cylinders to end users while minimizing or eliminating condensation in the transfer lines. The method is particularly useful in the transfer of specialty gases from liquid storage cylinders in gas cabinets to process tools used in the semiconductor manufacturing industry. The method can accommodate cyclic gas demands, improve the overall efficiency of the process tool, and allow longer distances between the pressurized liquid storage cylinder and the process tool.

What is claimed is:

1. A method for delivering a vapor component product to an end user from a storage system which contains the component in coexisting liquid and vapor phases, which method comprises:
   (a) withdrawing from the storage system a component stream comprising vapor at a first total pressure and a first temperature;
   (b) passing the component stream through a transfer line to a reservoir having an inlet and an outlet, and condensing vapor in the reservoir to provide a liquid component at a second total pressure and a second temperature at the outlet of the reservoir; and
   (c) withdrawing the liquid component from the outlet of the reservoir, vaporizing the liquid component to yield the vapor component, and providing the vapor component to the end user.

2. The method of claim 1 wherein the coexisting liquid and vapor phases of the component in the storage system are contained in a storage vessel, and wherein a vapor stream is withdrawn from the storage vessel while liquid is vaporized therein.

3. The method of claim 2 wherein the component stream withdrawn from the storage system in (a) is provided by regulating the pressure of the vapor stream from the storage vessel to provide the component stream at the first total pressure.

4. The method of claim 3 which further comprises heating the storage vessel.

5. The method of claim 1 wherein the dynamic pressure differential defined by the difference between the first total pressure and the second total pressure is at least about 1.25 psi.

6. The method of claim 1 wherein the difference between the first temperature and the second temperature is at least about 15° F.

7. The method of claim 1 wherein the component stream in the transfer line is essentially all vapor.

8. The method of claim 1 wherein the component is an essentially pure compound selected from the group consisting of tungsten hexafluoride, disilane, dichlorosilane, trichlorosilane, trimethylsilane, perfluorobutadiene, and chlorine.

9. The method of claim 8 wherein the total pressure at any point in the transfer line is less than the vapor pressure of the compound at a temperature equal to the temperature at that point in the transfer line.

10. The method of claim 1 wherein the second total pressure at the outlet of the reservoir is greater than the total pressure of the component stream at the inlet of the reservoir.

11. A method for controlling the delivery of a vapor component product to an end user from a storage system which contains the component in coexisting liquid and vapor phases, which method comprises:
  (a) withdrawing from the storage system a component stream comprising vapor at a first total pressure and a first temperature;
  (b) passing the component stream through a transfer line to a reservoir having an inlet and an outlet, and condensing vapor in the reservoir to provide a liquid component at a second total pressure and a second temperature at the outlet of the reservoir;
  (c) withdrawing the liquid component from the reservoir, vaporizing the liquid component to yield the vapor component, and providing the vapor component to the end user; and
  (d) controlling the first total pressure and the second temperature such that the component stream in the transfer line is essentially all vapor.

12. A system for delivering a vapor component product to an end user from a storage system which contains the component in coexisting liquid and vapor phases, which system comprises:
  (a) storage vessel which contains the component in coexisting liquid and vapor phases, wherein the storage vessel has an outlet for the withdrawal of vapor from the vessel;
  (b) a reservoir having an inlet and an outlet;
  (c) a transfer line for transferring a component stream comprising vapor from the storage vessel to the inlet of the reservoir;
  (d) cooling means for cooling the reservoir and condensing vapor to form a condensed component therein;
  (e) piping means for withdrawing the condensed component from the outlet end of the reservoir; and
  (f) heating means for vaporizing the condensed component to provide the vapor component to the end user.

13. The system of claim 12 which further comprises pressure regulating means installed between the storage vessel and the transfer line.

14. The system of claim 12 wherein the storage vessel is made of a metal containing at least 99.9 weight % nickel.

15. The system of claim 12 wherein the reservoir is a vertically-oriented cylindrical vessel having an upper end and a lower end, wherein the outlet is at the lower end, and wherein the vessel has a height to diameter ratio of at least about five.

16. The system of claim 15 wherein the cylindrical vessel is made of a metal containing at least 99.9 weight % nickel.

17. The system of claim 15 wherein the condensed component in the reservoir forms a liquid column with a height of at least about 12 inches above the outlet of the reservoir.

* * * * *